United States Patent [19]

Nguyen

[11] Patent Number: 5,477,933
[45] Date of Patent: Dec. 26, 1995

[54] ELECTRONIC DEVICE INTERCONNECTION TECHNIQUES

[75] Inventor: Hung N. Nguyen, Bensalem, Pa.

[73] Assignee: AT&T Corp., Murray Hill, N.J.

[21] Appl. No.: 327,959

[22] Filed: Oct. 24, 1994

[51] Int. Cl.⁶ ..................................... H05K 1/11
[52] U.S. Cl. .................. 174/262; 174/260; 228/180.22; 361/768; 361/790
[58] Field of Search ..................... 174/250, 260, 174/259, 262, 263, 264, 265, 266; 228/179, 180.1, 180.2; 361/760, 767, 777, 779, 784, 785, 790, 768

[56] References Cited

U.S. PATENT DOCUMENTS

| | | | |
|---|---|---|---|
| 4,744,007 | 5/1988 | Watari et al. | 361/386 |
| 4,868,712 | 9/1989 | Woodman | 361/388 |
| 5,155,302 | 10/1992 | Nguyen . | |
| 5,354,955 | 10/1994 | Gregor et al. . | |

OTHER PUBLICATIONS

"Cost–Effective Interconnections," by T. Caulfield et al., *Surface Mount Technology*, Jul. 1993, pp. 18–20.
"Ball Grid Arrays Have Arrive," Manufacturing Market Insider, vol. 2, No. 9, pp. 1–4.
"BGAs Face Production Testing," D. Hattas, Advanced Packaging, Summer 1993, pp. 44–46.

*Primary Examiner*—Laura Thomas
*Attorney, Agent, or Firm*—Roderick B. Anderson; Lester H. Birnbaum

[57] ABSTRACT

An electronic device (11) has on one surface a first ball grid array (12) having a first area. The first ball grid array is bonded to a first intermediate interconnection member (13) having on an opposite surface a second ball grid array having the same number of solder balls (23) as the first array, but of a significantly larger area than that of the first array. Each of the solder balls (23) of the second ball grid array is connected by a connection comprising a conductive via (18, 19) extending through the first interconnection member (13) to one of the solder balls of the first ball grid array.

19 Claims, 2 Drawing Sheets

5,477,933

ELECTRONIC DEVICE INTERCONNECTION TECHNIQUES

TECHNICAL FIELD

This invention relates to techniques for connecting an electronic device to external circuitry and, more particularly, to methods and apparatus for making contact to each one of a high density array of contact pads of a microelectronics chip.

BACKGROUND OF THE INVENTION

The U.S. patent of Nguyen, U.S. Pat. No. 5,155,302, granted Oct. 13, 1992, hereby incorporated herein by reference, describes the problem of making electrical connections to each of a matrix array of contact pads or bonding pads on one side of a microelectronic chip. For example, photodetector arrays require electrical contact to each of hundreds or thousands of photodetectors arranged as a matrix array on a single chip. The solution provided by the Nguyen patent is to superimpose over the contact array a number of layers of anisotropic material and insulator material having conductive vias. This allows interconnection to the various individual contacts by interconnection to peripheral contacts arranged on each successive insulator layer of the package. Electrical contact can be made by wire bonding to each one of the peripheral arrangement of bonding pads, which provides interconnection to all of the contacts of the matrix array.

An interconnection method that is, in many respects, superior to wire bonding is known as the surface mount method. By this method, solder elements are first bonded to bonding pads of a chip. The chip is next placed over a substrate such that the solder elements contact bonding pads of the substrate. The solder elements are then melted or reflowed so that each solder element forms an intimate bond with the bonding pad beneath it.

As described, for example, in the paper, "Cost-Effective Interconnections," Surface Mount Technology, July 1993, pp. 18–20, hereby incorporated herein by reference, a particular form of the surface mount method known as the ball grid array method can be used to connect simultaneously the solder balls of a matrix array to matching bonding pads of a substrate. A solder element or solder ball is attached to each bonding pad of a matrix array of bonding pads on a chip, with all of the solder balls being simultaneously reflowed and attached to a matrix array of bonding pads on the substrate. In this manner, hundreds of solder joints can be made simultaneously, with the simultaneous reflow causing a settling of the balls such that, for example, solder balls that are undersized may nevertheless provide good contact. The ball grid array method therefore provides known advantages of both efficiency and reliability.

Where the density of the solder balls is extremely great, such as in photodetector arrays, there still may be a problem with making contact to the matrix array of bonding pads to which the solder balls are bonded; the space between the bonding pads may be insufficient to provide access conductors at reasonable cost. There is no obvious way of using the techniques of the Nguyen patent while still obtaining the advantages of the ball grid array method. There is therefore a long-felt need in the industry for methods for making separate electrical contact to each bonding pad of a dense matrix array of the type used for ball grid array bonding.

SUMMARY OF THE INVENTION

In one embodiment of the invention, an electronic device such as a semiconductor chip has on one surface a first ball grid array having a first area. The first ball grid array is bonded to an intermediate interconnection member having on an opposite surface a second ball grid array having the same number of solder balls as the first array, but of a significantly larger area than that of the first array. Each of the solder balls of the second ball grid array is connected by a connection comprising a conductive via extending through the first interconnection member to one of the solder balls of the first ball grid array. The second ball grid array is in turn bonded to an array of bonding pads from which it is easier to make connections to external circuitry because it has a larger area than the first ball grid array. That is, there is more space between the bonding pads on which to make printed circuit conductors. Preferably, the solder of the first ball grid array has a higher melting point than that of the second ball grid array so that, when the second ball grid array is reflowed for making the required surface mount, the solder balls in the first ball grid array are not affected.

The above process can be extended by surface mounting the intermediate interconnection member onto a second intermediate interconnection member which contains conductive vias for connecting the second ball grid array to a third ball grid array having a larger area than the second ball grid array. Preferably, the solder balls of the third ball grid array have a lower melting point than those of the second ball grid array so that, when the third ball grid array is melted for reflow, the solder balls of neither the first nor second ball grid arrays are affected. By further iterations, one can expand the area of the ball grid array as much as is desired.

These and other objects, features and advantages of the invention will be better understood from a consideration of the following detailed description taken in conjunction with the accompanying drawing.

DETAILED DESCRIPTION

Figure 1:
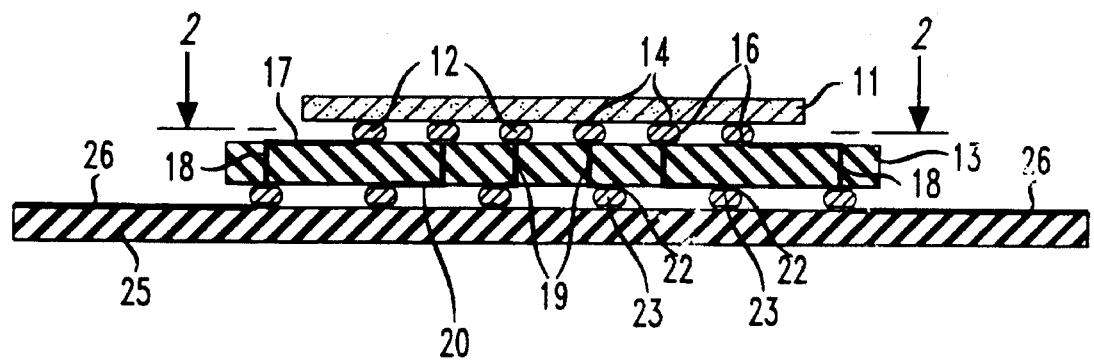
FIG. 1 is a schematic sectional view of an electronic device package in accordance with one embodiment of the invention.
Figure 2:
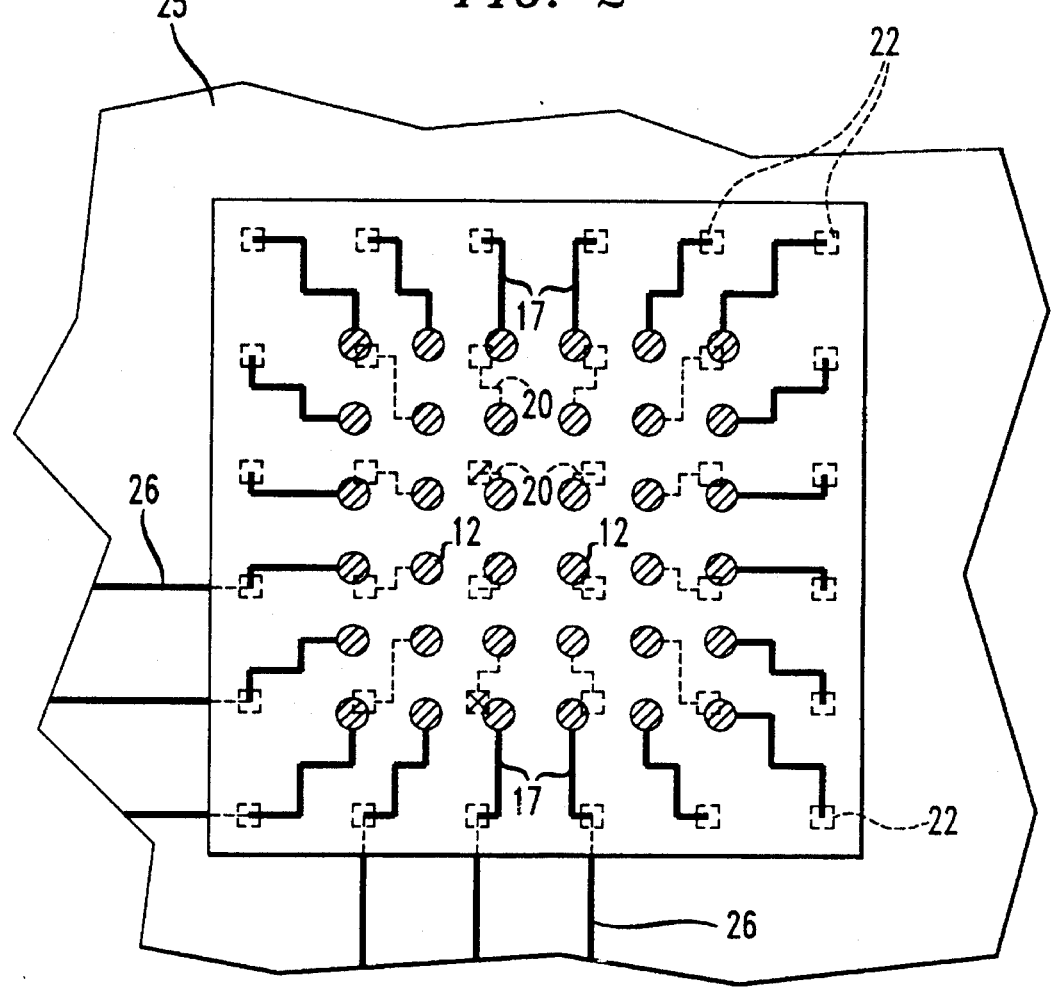
FIG. 2 is a view taken along lines 2—2 of FIG. 1.

The drawings are schematic in nature, with the dimensions in some cases being intentionally distorted to aid in clarity of exposition. Referring now to FIGS. 1 and 2, there is shown an electronic device package in accordance with one embodiment of the invention comprising a microelectronic chip 11 having bonded to its lower surface a ball grid array of solder balls 12. As shown in FIG. 2, the ball grid array illustratively comprises a matrix array of solder balls 12. For example, the semiconductor chip may comprise a matrix array of photodetectors, each of which is electrically contacted by a different one of the solder balls 12. Although for purposes of illustration, only a six by six (thirty-six) array of solder balls is shown, in practical applications, a photodetector matrix array would typically comprise thousands of photodetectors each contacted by a separate solder ball. It can be appreciated that, with such density, it is difficult to provide an electronic device package that can be easily assembled, but which nevertheless provides reliable electrical contact at a relatively low cost. The chip 11 may alternatively be any of various other kinds of electronic device, such as a microprocessor.

Figure 3:
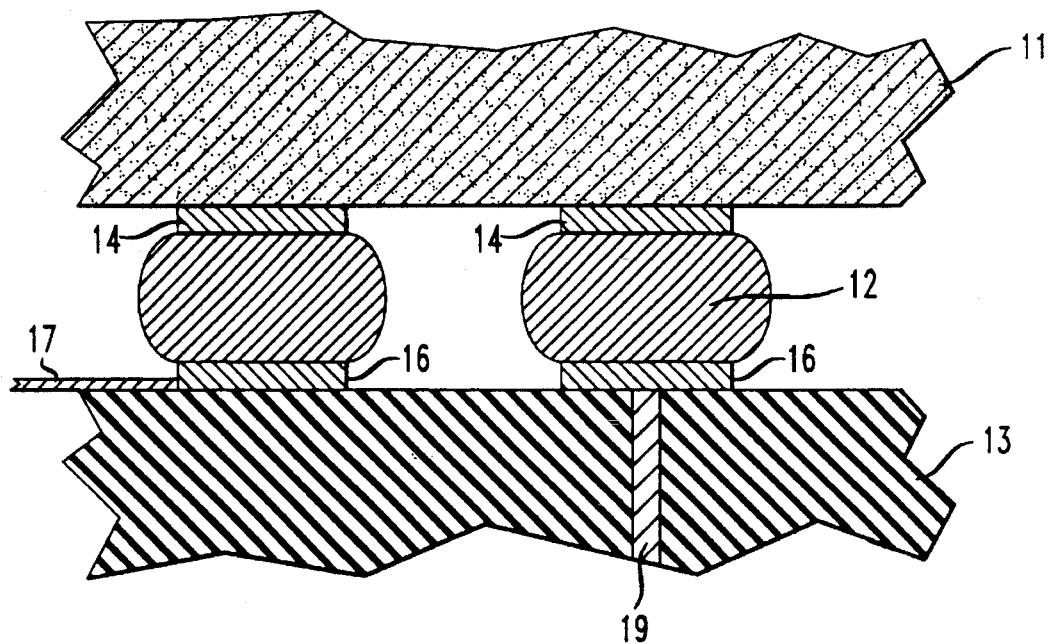
FIG. 3 is an enlarged view of two of the solder balls of FIG. 1.

Referring to FIG. 3, the solder balls 12 of the chip 11 are mounted on an intermediate interconnection member 13 of insulative material using the known ball grid array mounting method. Each solder ball 12 is initially bonded to a separate bonding pad 14 of the microelectronic chip 11. Each ball is thereafter placed in contact with a matching bonding pad 16 of member 13. The assembly is next heated to a temperature slightly above the melting point of the solder material 12, which is sufficient to cause partial liquefication or "reflow." Such reflow causes the solder to fuse to the bonding pads 16 to provide permanent bonding. The reflow also causes the chip 11 to settle, or to move a small distance closer to member 13, causing the reflowed solder members 12 to bulge. This has the benefit of assuring good contact of all of the balls to bonding pads 14 and 16; for example, if one of the solder balls is slightly undersized, the settling will nevertheless cause it to make a good contact. The reflow of course is carefully controlled, as is well understood in the art, so that none of the solder balls completely liquefies.

In accordance with the invention, each of the solder balls 12 on the periphery of the array is connected by a conductive trace 17 on the upper surface of intermediate interconnection member 13 to a conductive via 18 extending through the intermediate interconnection member 13, and then to a bonding pad 22. Each of the remaining solder balls 12 is connected by a conductive via 19 to a conductive trace 20 on the lower surface of the intermediate interconnection member 13; each conductive trace 20 is connected to a separate bonding pad 22 on the lower surface of intermediate interconnection member 13. To each of the bonding pads 22 is bonded a solder ball 23.

All of the solder balls 23 constitute a second ball grid array which has a significantly larger area than that of the first ball grid array of solder balls 12. Consequently, the solder balls 23 are easier to connect to external circuitry via conductive traces 26. That is, the solder balls 23 are surface mounted on bonding pads which form an array on the upper surface of a substrate 25 having a larger area than that of the ball grid array on the microchip 11. Thus, there is more space between adjacent bonding pads and it is easier to make conductive traces 26 on the upper surface of substrate 25 for providing an electrical connection to each of the solder balls 23 than it would be to provide such interconnections on the upper surface of intermediate interconnection member 13 to solder balls 12. This is illustrated in FIG. 2; clearly there is more space between bonding pads 22 than between solder balls 12. Intermediate interconnection member 13 has the effect of spreading out the ball grid array to make its area larger and thus easier to contact. Interconnection of all of the bonding pads 22 to external circuitry is not shown for reasons of clarity and brevity. In most embodiments, the area of the second array would probably exceed twice the area of the first array; in any event, it would normally be more than twenty percent greater than the area of the first array. The actual increase would of course depend on the need for more area on which to make interconnecting traces.

In accordance with one feature of the invention, solder balls 12 are made to have a higher melting point than solder balls 23. Consequently, when solder balls 23 are melted, the solder balls 12, which are bonded both to the chip 11 and to the intermediate interconnection member 13, are not affected. For example, solder balls 12 may be made of AuGe (88/12) alloy, which has a melting point of three hundred sixty degrees Centigrade, whereas solder balls 23 may be made of PbSn (95/5) alloy, which has a melting point of three hundred ten degrees Centigrade. Thus, for reflowing solder balls 23, the entire package may be heated, for example, to three hundred twelve degrees Centigrade, which is sufficient for reflowing solder balls 23, but which will not affect solder balls 12. AuGe (88/12) means an alloy that is eighty-eight percent by weight gold and twelve percent by weight of germanium. Pb is lead, and Sn is antimony.

Figure 4:
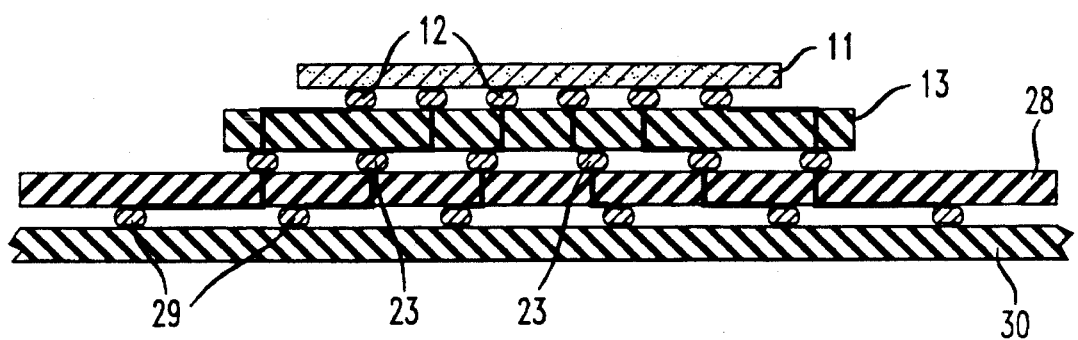
FIG. 4 is a schematic view of another embodiment of the invention.

Referring to FIG. 4, a second intermediate connection member 28 may be used to increase further the area of the ball grid array. That is, second intermediate interconnection member 28 operates in the same manner as first intermediate interconnection member 13 to increase the area of the ball grid array. Each of the solder balls 23 is connected to one of the solder balls 29 which form a third ball grid array having a larger area than the second ball grid array of solder balls 23. The combination of conductive vias and conductive traces on upper and lower surfaces of the insulative second intermediate interconnection member. 28 may be identical in organization to those on the first intermediate interconnection member 13, shown in FIGS. 1 and 2, and, for brevity, their detailed description will be omitted. The solder balls 29 preferably have a lower melting point than those of either the solder balls 23 or the solder balls 12. For example, solder balls 29 may be AuSn (80/20) alloy, which has a melting point of two hundred eighty-one degrees Centigrade. Thus, when solder balls 29 are reflowed for bonding to bonding pads of a substrate 30, solder balls 23 and 12 are not affected.

From the foregoing, it can be appreciated that any of a number of progressively larger intermediate interconnection members can be added to spread out even further the area of the final ball grid array to which contact to external circuitry must be made. Such other ball grid arrays may be made, for example, of PbSn (37/63) alloy, having a melting point of one hundred eighty-three degrees Centigrade, and of indium, having a melting point of one hundred fifty degrees Centigrade. It is not necessary that each ball grid array form a matrix array but, in keeping with known principles of the ball grid array method, the solder balls of the array should be fairly uniformly distributed to give a substantially uniform downward force on the reflowed solder balls. While the term "solder balls" is used for reasons of custom and convenience, it is to be understood that the solder contact elements may be of other shapes, such as cylinders, as known in the art. If it is tolerable to reflow each of the solder balls a number of times, they can all be of the same material.

The particular configurations of the traces on the upper and lower surfaces of the intermediate interconnection members are intended to be illustrative only, and various other configurations can be used. The conductor traces are preferably made by known primed circuit methods, i.e., photolithographic masking and etching. As was mentioned before, it is foreseen that the invention will be used with a matrix array including thousands of individual solder contacts, with rather complex conductor patterns being used to spread the area of the matrix array in accordance with the invention. In place of microelectronic chip 11 one could use a modern multichip module (MCM) comprising a plurality of chips, or any of various other known electronic devices. Various other embodiments and modifications may be made by those skilled in the art without departing from the spirit and scope of the invention.

I claim:

1. An electronic device package comprising:

an electronic device having on one surface thereof a first ball grid array of first solder contact elements, the first array having a first area;

a first intermediate interconnection member having on a first surface thereof a first array of bonding pads each bonded to a first solder contact element, and, on a second surface thereof opposite the first surface, a second ball grid array of second solder contact elements;

the number of second solder contact elements of the second ball grid array equaling the number of first solder contact elements in the first ball grid array;

the area of the second ball grid array being significantly larger than the area of the first ball grid array;

each second solder contact element being connected to a first solder contact element by interconnection means comprising a conductive via extending through the first intermediate interconnection member;

and each of the second solder contact elements being bonded to one of a second array of bonding pads of a connecting member.

2. The electronic device package of claim 1 wherein:

a first plurality of the first array of bonding pads is interconnected by first conductive traces on the first surface of the first intermediate interconnection member to first conductive vias;

a second plurality of said first array of bonding pads is connected to second conductive vias;

the second conductive vias are each connected by a second conductive trace on the second surface of the intermediate interconnection member to a second solder contact element.

3. The electronic device package of claim 1 wherein:

all of the first solder contact elements are bonded simultaneously to the first array of bonding pads by surface mounting;

and all of the second solder contact elements are bonded simultaneously to the second array of bonding pads by surface mounting;

and the second ball grid array has an area more than twenty percent greater than the area of the first ball grid array.

4. The package of claim 3 wherein:

all of the first solder contact elements are made of a first material having a first melting point;

and all of the second solder contact elements are made of a second material having a second melting point which is lower than said first melting point.

5. The package of claim 4 wherein:

a first plurality of the first array of bonding pads is connected by first conductive traces on the first surface of the first intermediate interconnection member to first conductive vias which are connected to second solder contact elements;

a second plurality of the first array of bonding pads is connected directly to second conductive vias which are connected by second conductive traces on the second surface of the first intermediate interconnection member to second solder contact elements.

6. The electronic device package of claim 5 wherein:

all of the first and second solder contact elements are solder balls.

7. The electronic device package of claim 2 wherein:

each of the first conductive vias is directly connected through a bonding pad to one of the second solder contact elements;

and each of the second conductive vias is directly connected through a bonding pad to one of the first solder contact elements.

8. The package of claim 1 wherein:

the connecting member to which the first intermediate interconnection member is bonded is a substrate containing a printed circuit which connects the second solder contact elements to external circuitry.

9. The package of claim 1 wherein:

the connecting member to which the first intermediate interconnection member is bonded is a second intermediate interconnection member having on a first surface thereof a third array of bonding pads each bonded to second solder contact elements, and on a second surface thereof a third ball grid array of third solder contact elements;

the number of third solder contact elements of the third ball grid array equaling the number of second solder contact elements in the second ball grid array;

the area of the third ball grid array being significantly larger than the area of the second ball grid array;

each third solder contact element being connected to a second solder contact element by an interconnection member comprising a conductive via extending through the second intermediate interconnection member;

each of the third solder contact elements being bonded to one of a third array of bonding pads of a second connecting member.

10. The package of claim 9 wherein:

all of the first solder contact elements are made of a first material having a first melting point;

all of the second solder contact elements are made of a second material having a second melting point which is lower than said first melting point;

and all of the third solder contact elements are made of a third material having a third melting point which is lower than said second melting point.

11. The package of claim 10 wherein:

a first plurality of the first array of bonding pads is interconnected by first conductive traces on the first surface of the first intermediate interconnection member to first conductive vias, and thence to second solder contact elements;

a second plurality of said first array of bonding pads is connected directly to the second conductive vias and thence to second conductive traces on the second surface of the first intermediate interconnection member to second solder contact elements;

a first plurality of said second solder contact elements is interconnected by third conductive traces on the first surface of the second intermediate interconnection member to third conductive vias, and thence to third solder contact elements;

a second plurality of said second solder contact elements is connected directly to fourth conductive vias, and thence to fourth conductive traces on the second surface of the second intermediate interconnection member to third solder contact elements.

12. An electronic device package comprising:

an electronic device having on one surface thereof a first plurality of first contact elements;

said first contact elements being bonded to a plurality of second contact elements on a first surface of a first insulative member;

said first insulative member including on a second surface thereof a plurality of third conductive elements;

each second conductive element being electrically connected to a third conductive element;

the average distance between adjacent third conductive elements on the second surface being significantly greater than the average distance between adjacent second conductive elements on the first surface;

and means for electrically connecting each third conductive element to external circuitry.

13. The package of claim 12 wherein:

the third conductive elements are each bonded to a fourth conductive element on a first surface of a second insulative member;

and the means for electrically connecting comprises conductors, on the first surface of the second insulative member, connected to the fourth conductive elements.

14. The device package of claim 12 wherein:

the third conductive elements are each bonded to a fourth conductive element on a first surface of a second insulative member;

said second insulative member includes on a second surface thereof a plurality of fifth conductive elements, each electrically connected to a fourth conductive element;

the distance between adjacent fifth conductive elements is significantly greater than the distance between adjacent third conductive elements;

and the means for electrically connecting comprises means for electrically connecting each fifth conductive element to external circuitry.

15. The package of claim 14 wherein:

the first conductive elements each comprise solder having a first melting point;

the third conductive elements each comprise solder having a second melting point lower than the first melting point;

and each fifth conductive element comprises solder having a third melting point that is lower than the second melting point.

16. The package of claim 12 wherein:

the first conductive elements comprise first solder which is bonded to the second conductive elements by surface mounting;

and each third conductive element comprises solder which is bonded to bonding pads of a second insulative member by surface mounting.

17. The package of claim 16 wherein:

each second contact element is connected to only one third contact element by a conductor comprising a conductive via extending through the insulative member.

18. The package of claim 17 wherein:

the first conductive elements are substantially uniformly distributed within a first area;

and the third conductive elements are substantially uniformly distributed within a second area which is more than twenty percent greater than said first area.

19. The package of claim 18 wherein:

the first conductive elements are arranged in a matrix array;

and the second area is at least twice the first area.

\* \* \* \* \*